United States Patent
Krishnasamy et al.

(10) Patent No.: US 12,310,124 B2
(45) Date of Patent: May 20, 2025

(54) PHOTODIODES

(71) Applicant: GLOBALFOUNDRIES U.S. Inc., Malta, NY (US)

(72) Inventors: Rajendran Krishnasamy, Essex Junction, VT (US); John J. Ellis-Monaghan, Grand Isle, VT (US); Siva P. Adusumilli, South Burlington, VT (US); Ramsey Hazbun, Colchester, VT (US); Steven M. Shank, Jericho, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 290 days.

(21) Appl. No.: 17/709,181

(22) Filed: Mar. 30, 2022

(65) Prior Publication Data

US 2023/0317869 A1    Oct. 5, 2023

(51) Int. Cl.
*H10F 30/223* (2025.01)
*H10F 71/00* (2025.01)
*H10F 77/20* (2025.01)

(52) U.S. Cl.
CPC ....... *H10F 30/223* (2025.01); *H10F 71/1215* (2025.01); *H10F 77/206* (2025.01)

(58) Field of Classification Search
CPC ........... H01L 31/105; H01L 31/022408; H01L 31/1812; H10F 30/223; H10F 30/2235; H10F 71/1215; H10F 77/206; H10F 39/103

See application file for complete search history.

(56) References Cited

U.S. PATENT DOCUMENTS

| | | |
|---|---|---|
| 2,557,110 A | 6/1951 | Jaynes |
| 2,619,538 A | 11/1952 | Grant |
| 3,787,871 A | 1/1974 | Reese |
| 4,481,523 A | 11/1984 | Osaka |
| 4,799,031 A | 1/1989 | Lang et al. |
| 4,847,210 A | 7/1989 | Wang et al. |
| 5,625,210 A | 4/1997 | Lee et al. |
| 5,880,495 A | 3/1999 | Chen |
| 5,994,724 A | 11/1999 | Morikawa et al. |
| 6,147,349 A | 11/2000 | Ray |
| 6,180,945 B1 | 1/2001 | Barton et al. |
| 6,218,210 B1 | 4/2001 | Park |

(Continued)

FOREIGN PATENT DOCUMENTS

| | | | |
|---|---|---|---|
| CN | 105874613 A | * | 8/2016 |
| KR | 20100070610 | | 6/2010 |

OTHER PUBLICATIONS

Office Action in U.S. Appl. No. 17/863,922 dated Nov. 8, 2022, 8 pages.

(Continued)

*Primary Examiner* — Sitaramarao S Yechuri
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to photodiodes and methods of manufacture. The structure includes: a top terminal; an intrinsic material in contact with the top terminal; and a bottom terminal in contact with the intrinsic material, the bottom terminal including a P semiconductor material and a fully depleted N semiconductor material.

18 Claims, 2 Drawing Sheets

(56) References Cited

U.S. PATENT DOCUMENTS

| | | | |
|---|---|---|---|
| 6,921,934 | B2 | 7/2005 | Patkick |
| 7,002,429 | B2 | 2/2006 | Asao et al. |
| 7,361,526 | B2 | 4/2008 | Maa et al. |
| 7,397,101 | B1 | 7/2008 | Masini et al. |
| 7,618,839 | B2 | 11/2009 | Rhodes |
| 7,777,250 | B2 | 8/2010 | Lochtefeld |
| 7,790,495 | B2 | 9/2010 | Assefa et al. |
| 7,795,064 | B2 | 9/2010 | Pan et al. |
| 7,871,854 | B1 * | 1/2011 | Spencer .............. H01L 31/1804 438/273 |
| 7,902,540 | B2 | 3/2011 | Cohen |
| 9,064,699 | B2 | 6/2015 | Wang et al. |
| 9,478,625 | B1 | 10/2016 | Zang et al. |
| 9,711,550 | B2 | 7/2017 | FaVennec et al. |
| 9,864,138 | B2 | 1/2018 | Coolbaugh et al. |
| 10,074,687 | B2 | 9/2018 | Kurokawa |
| 10,157,947 | B2 | 12/2018 | Chen et al. |
| 10,359,569 | B2 | 7/2019 | Dumais |
| 10,861,888 | B2 | 12/2020 | Na et al. |
| 11,004,878 | B2 | 5/2021 | Stamper et al. |
| 11,079,544 | B2 | 8/2021 | Bian et al. |
| 11,125,944 | B2 | 9/2021 | Bian et al. |
| 2003/0030814 | A1 | 2/2003 | Osinski et al. |
| 2005/0133723 | A1 | 6/2005 | Lee et al. |
| 2007/0099315 | A1 | 5/2007 | Maa et al. |
| 2008/0070355 | A1 | 3/2008 | Lochtefeld et al. |
| 2008/0230783 | A1 | 9/2008 | Lim |
| 2008/0257409 | A1 | 10/2008 | Li et al. |
| 2011/0037133 | A1 | 2/2011 | Su et al. |
| 2012/0213468 | A1 | 8/2012 | Lipson et al. |
| 2013/0149806 | A1 | 6/2013 | Kim et al. |
| 2013/0241021 | A1 | 9/2013 | Stenson |
| 2014/0159183 | A1 | 6/2014 | Na |
| 2014/0185979 | A1 | 7/2014 | Evans et al. |
| 2014/0197507 | A1 | 7/2014 | Assefa et al. |
| 2014/0217269 | A1 | 8/2014 | Guo et al. |
| 2015/0008493 | A1 * | 1/2015 | Ni ..................... H01L 27/14616 257/292 |
| 2015/0008512 | A1 | 1/2015 | Lemke et al. |
| 2015/0075599 | A1 | 3/2015 | Yu |
| 2015/0091065 | A1 | 4/2015 | Wei et al. |
| 2015/0097256 | A1 | 4/2015 | Ang et al. |
| 2015/0115333 | A1 | 4/2015 | Bobde et al. |
| 2016/0155884 | A1 | 6/2016 | Hon et al. |
| 2018/0190702 | A1 * | 7/2018 | Na ..................... H01L 31/1037 |
| 2018/0204761 | A1 | 7/2018 | Feilchenfeld et al. |
| 2020/0006155 | A1 | 1/2020 | Chang et al. |
| 2020/0020734 | A1 | 1/2020 | Wang et al. |
| 2020/0105812 | A1 | 4/2020 | Sze |
| 2021/0223478 | A1 | 7/2021 | Song et al. |
| 2021/0305313 | A1 | 9/2021 | Pan et al. |
| 2021/0305449 | A1 | 9/2021 | Wang et al. |
| 2021/0320217 | A1 | 10/2021 | Levy et al. |
| 2021/0376180 | A1 | 12/2021 | Adusumilli |
| 2022/0029032 | A1 | 1/2022 | Levy et al. |
| 2022/0181378 | A1 * | 6/2022 | Yen-Cheng ....... H01L 27/14609 |

OTHER PUBLICATIONS

Response to Office Action in U.S. Appl. No. 17/863,922 dated Feb. 7, 2023, 8 pages.
Fossum et al., "A Review of the Pinned Photodiode for CCD and CMOS Image Sensors", IEEE Journal of the Electron Devices Society, May 2014, vol. 2, No. 3, 11 pages.
Yu, "High-Efficiency p-i-n Photodetectors on Selective-Area-Grown Ge for Monolithic Integration", IEEE Electron Device Letters, vol. 30, Issue 11, Nov. 2009, 4 pages.
Knoll, "High-Performance BiCMOS Si Photonics Platform", IEEE, 2015, 8 pages.
Liao et al., "36 GHz submicron silicon waveguide germanium photodetector", Optics Express, vol. 19, Issue 11, May 20, 2011, 6 pages.
Huang et al., "Germanium on Silicon Avalanche Photodiode", IEEE Journal of Selected Topics in Quantum Electronics vol. 24, No. 2, Mar./Apr. 2018, 11 pages.
Jutzi et al., "Ge-on-Si Vertical Incidence Photodiodes With 39-GHz Bandwidth", IEEE Photonics Technology Letters, vol. 17, Issue 7, Jul. 2005, 3 pages.
Koester et al., "Germanium-0n-Insulator Photodetectors", IEEE, Oct. 2005, 3 pages.
Notice of Allowance in U.S. Appl. No. 17/863,922 dated Feb. 15, 2023, 7 pages.
Office Action in U.S. Appl. No. 16/935,854 dated Sep. 2, 2022, 11 pages.
Response to Office Action in U.S. Appl. No. 16/935,854 dated Oct. 25, 2022, 12 pages.
German Office Action dated Jul. 29, 2022 in related Application No. 10 2021 122 575.2, 6 pages.
English Translation of the German Office Action dated Jul. 29, 2022 in related Application No. 10 2021 122 575.2, 1 page.
Notice of Allowance dated May 18, 2022 in related U.S. Appl. No. 17/065,862, 7 pages.
Chinese Office Action dated Nov. 2, 2023 in CN Application No. 202110564834.5, 8 pages.
Brief English Translation of the Chinese Office Action dated Nov. 2, 2023 in CN Application No. 202110564834.5, 1 page.
Chinese Notice of Allowance dated May 17, 2024 in CN Application No. 202110564834.5 and it's English Machine Translation, 8 pages.
Chinese Notice of Allowance dated Feb. 5, 2024 in CN Application No. 202110974286.3, 2 pages.
Brief English Translation of the Chinese Notice of Allowance dated Feb. 5, 2024 in CN Application No. 202110974286.3, 1 page.
Chinese Office Action dated Dec. 28, 2023 in CN Application No. 202110261431.3, 10 pages.
Brief English Translation of the Chinese Office Action dated Dec. 28, 2023 in CN Application No. 202110261431.3, 1 page.
Chinese Office Action dated Jun. 26, 2024 in CN. Application No. 202111171259.9, 9 pages.
Foreign Office Action dated Jan. 11, 2025 in CN Application No. 202111171259.9 10 pages.

* cited by examiner

PHOTODIODES

BACKGROUND

The present disclosure relates to semiconductor structures and, more particularly, to photodiodes and methods of manufacture.

A photodiode is a semiconductor device that converts light into an electrical current. Many diodes designed for use as a photodiode use a PIN junction rather than a p-n junction to increase the speed of response.

Photodiodes are similar to semiconductor diodes except that they may be either exposed to detect vacuum UV or X-rays or packaged with a window or optical fiber connection to allow light to reach the sensitive part of the device. The current is generated when photons are absorbed in the photodiode. For example, when a photon of sufficient energy strikes the diode, it creates an electron-hole pair. This mechanism is also known as the photoelectric effect. The total current through the photodiode is the sum of the dark current (current that is generated in the absence of light) and the photocurrent, so the dark current must be minimized to maximize the sensitivity of the device.

SUMMARY

In an aspect of the disclosure, a structure comprises: a top terminal; an intrinsic material in contact with the top terminal; and a bottom terminal in contact with the intrinsic material, the bottom terminal comprising a P semiconductor material and a fully depleted N semiconductor material.

In an aspect of the disclosure, a structure comprises: a pinned photodiode comprising a fully depleted semiconductor region; and a transistor pinned to the pinned photodiode.

In an aspect of the disclosure, a method comprises: forming a top terminal; forming an intrinsic material in contact with the top terminal; and forming a bottom terminal in contact the intrinsic material, the bottom terminal comprising a P semiconductor material and a fully depleted N semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodiodes and methods of manufacture. More specifically, the present disclosure is related to pinned photodiode structures and methods of manufacture. In embodiments, the pinned photodiodes include a fully depleted semiconductor region. Advantageously, the pinned photodiode structures provide improved performance, e.g., provides low noise and low dark current, compared to conventional photodiode structures. Moreover, the pinned photodiode structures can be easily integrated into a front-end-of-line (FEOL) process using known processes.

In more specific embodiments, the pinned photodiode structures may include an intrinsic semiconductor material, with N and P semiconductor materials at a bottom of the structure and a heavily doped P+ semiconductor material at a top of the structure. In embodiments, the P+ semiconductor material may be a top terminal and the N and P semiconductor materials may be a bottom terminal for the pinned photodiode structures. The intrinsic semiconductor material may be any appropriate semiconductor material, e.g., Ge, InGaAs, etc., depending on which wavelength of light is to be detected by the pinned photodiode structures. Also, in embodiments, the N semiconductor material may be fully depleted at a known bias. For example, to be fully depleted, the bottom P semiconductor material may have a doping charge higher than the N semiconductor material such that with an applied bias the N semiconductor material can be fully depleted (resulting in the pinned photodiode operation). The pinned photodiode structures may also be integrated into FET structures for read out.

The photodiodes of the present disclosure can be manufactured in a number of ways using a number of different tools. In general, though, the methodologies and tools are used to form structures with dimensions in the micrometer and nanometer scale. The methodologies, i.e., technologies, employed to manufacture the photodiodes of the present disclosure have been adopted from integrated circuit (IC) technology. For example, the structures are built on wafers and are realized in films of material patterned by photolithographic processes on the top of a wafer. In particular, the fabrication of the photodiodes uses three basic building blocks: (i) deposition of thin films of material on a substrate, (ii) applying a patterned mask on top of the films by photolithographic imaging, and (iii) etching the films selectively to the mask.

Figure 1:
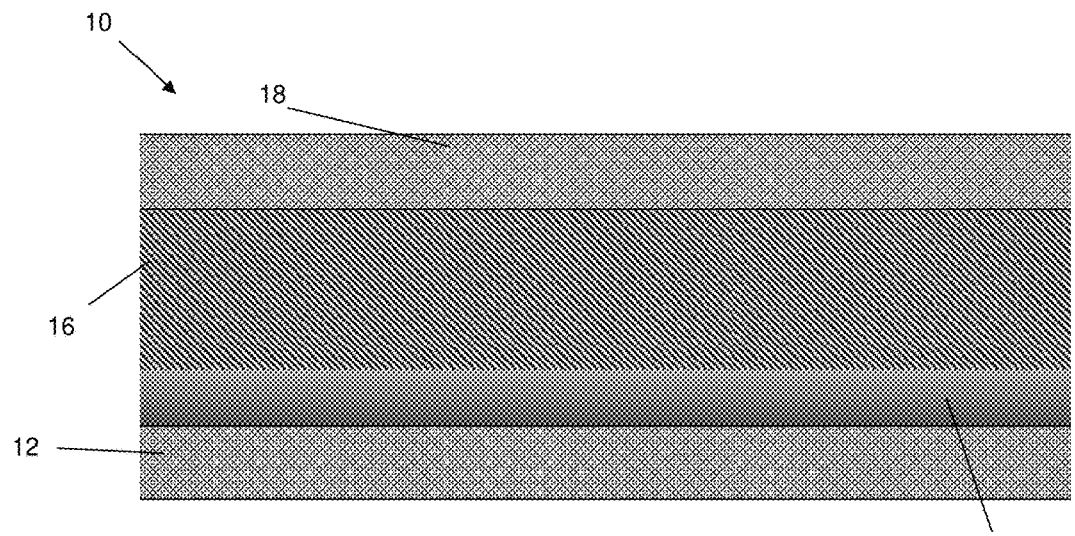
FIG. 1 shows a photodiode in accordance with aspects of the present disclosure.

FIG. 1 shows a pinned photodiode structure in accordance with aspects of the present disclosure. In particular, the pinned photodiode structure 10 includes a P semiconductor material 12 at a bottom of the structure. The photodiode structure 10 further includes an N semiconductor material 14 on the P semiconductor material 12. In embodiments, both the N semiconductor material 14 and the P semiconductor material 12 may be Si.

In embodiments, the semiconductor material 12 may be doped with P dopants, e.g., Boron of about $e18/cm^3$ dopant level, and the semiconductor material 14 may be doped with N dopants, e.g., Arsenic, Phosphorous, Antimony, etc. of about $e17/cm^3$ dopant level. The dopants may be provided through an ion implantation process as is known in the art and described in more detail herein. In further embodiments, the N semiconductor material 14 may be doped at a lower concentration than the P semiconductor material 12, e.g., in an n region nominally about e17 and in a p region nominally about $e18/cm^3$. In this way, upon application of an applied voltage, the N semiconductor material 14 may become fully depleted (i.e., resulting in the pinned photodiode operation), which provides the advantage of low noise and low dark current as described in more detail herein.

It should also be understood by those of skill in the art that the doping level of the N semiconductor material 14 may be adjusted depending on the applied voltage bias. For example, a photodiode designed for a 5V bias would have a higher doping of the N semiconductor material 14 than for a 0.5V bias. In embodiments, the higher bias results in more depletion for the same dopant concentration, thus if designed for a higher bias, it is possible to use a higher dopant concentration.

Still referring to FIG. 1, an intrinsic semiconductor material 16 may be formed on (in contact with) the N semiconductor material 14. In embodiments, the intrinsic semiconductor material 16 may be epitaxially grown on the N semiconductor material 14. The intrinsic semiconductor material 16 may be Ge, although other semiconductor materials are contemplated herein depending on the wavelength (or frequency) of light to be detected. For example, Ge material may be used to detect infrared wavelengths, whereas InGaAs may be used to detect shortwave infrared wavelengths. A P+ semiconductor material 18 (e.g., biasable region) may be formed on the intrinsic semiconductor material 16. In embodiments, the P+ semiconductor material 18 may be formed by an epitaxial growth process and may comprise Si/polysilicon material.

Figure 2:
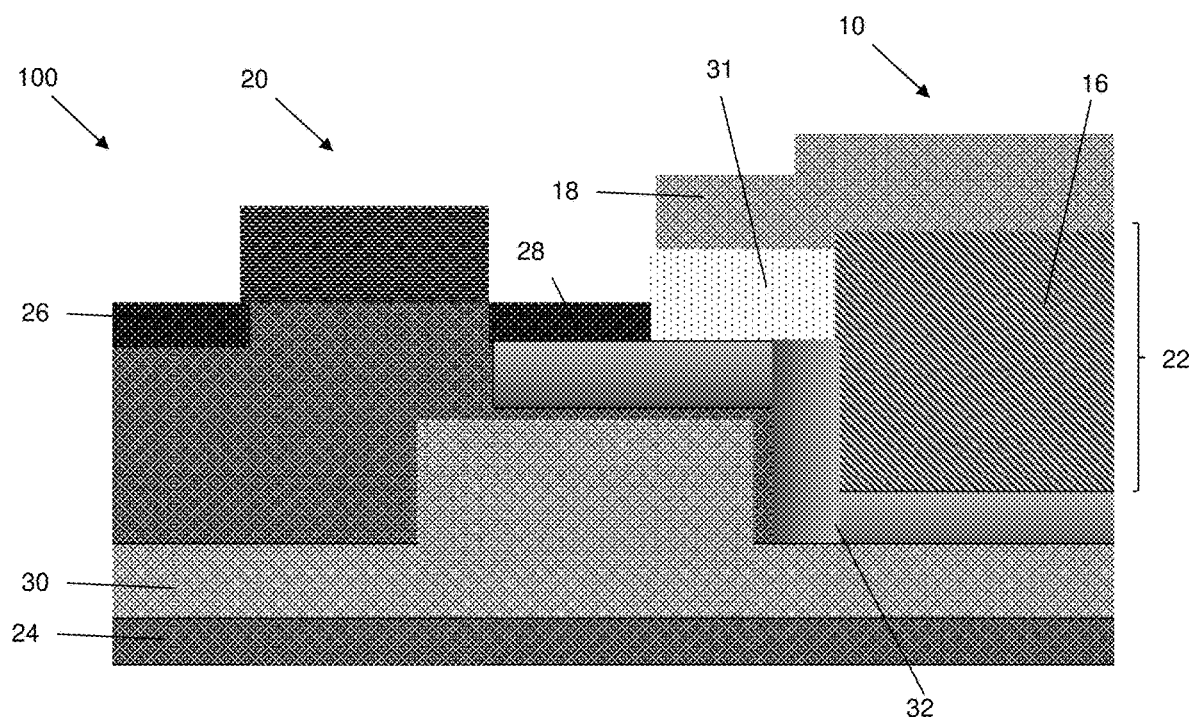
FIGS. 2 and 3 show the photodiode integrated with a CMOS device, amongst other features, in accordance with aspects of the present disclosure.

FIG. 2 shows the photodiode structure integrated with a CMOS device, amongst other features. By integrating (e.g., connecting) the photodiode structure (e.g., pinned photodiode) with the CMOS device, it is now possible to read out the result of the detected light thereby providing a silicon pinned CMOS imager. That is, the integrated device 100 includes a pinned diode connection between the FET and the pinned photodiode structure 10.

For example, the integrated device 100 includes the pinned photodiode structure 10 connected to a CMOS device 20, e.g., FET. In embodiments, the pinned photodiode structure 10 may be formed in a trench 22 of a substrate 24 used for the CMOS device 20. The CMOS device 20 may be a conventional transistor formed by any known processes, e.g., gate first process or replacement gate process, with a source region 26 (e.g., N+ region) and pinned drain region 28 (e.g., P/N region). A shallow trench isolation structure 31 may be adjacent to the drain region 28, separating the CMOS device 20 from the photodiode structure 10, e.g., intrinsic semiconductor material 18. The shallow trench isolation structure 31 may be a raised structure or planar with the substrate 24.

In embodiments, the substrate 24 may be a pSi semiconductor substrate, with a heavily doped P region 30 and lighter doped N region 32. In embodiments, the heavily doped P region 30 and the lighter doped N region 32 may be formed underneath the trench 22 within the substrate 24. It should be understood by those of skill in the art that the heavily doped P region 30 and the lighter doped N region 32 may be representative of the bottom terminal of the pinned photodiode structure 10, e.g., N semiconductor material 14 and P semiconductor material 12 of FIG. 1. The N doped region 32, e.g., N semiconductor material 14 of FIG. 1, may extend to and contact an underside of the drain region 28. The connection between the N doped region 32, e.g., N semiconductor material 14 of FIG. 1, and the drain region 28 form a pinned connection between the pinned photodiode structure 10 and the CMOS device 20, e.g., FET.

The doped regions, e.g., source region 26 (e.g., N+ region), drain region 28 (e.g., P/N region), heavier doped P region 30 and the N doped region 32 may be formed by introducing a dopant using, for example, ion implantation that introduces a concentration of a dopant in the substrate 24 (prior to the trench formation). The doped regions may be formed by introducing a concentration of a different dopant of opposite conductivity type in the substrate 24. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-type dopants may be, e.g., Boron (B), and the n-type dopants may be, e.g., Arsenic (As), Phosphorus (P) and Antimony (Sb), among other suitable examples.

Still referring to FIG. 2, the intrinsic semiconductor material 16 may be epitaxially grown in the trench 22 over the N doped region 32. The P+ semiconductor material 18 may be epitaxially grown on the intrinsic semiconductor material 16, with an in-situ doping process. In embodiments, an oxide or other hardmask material may be used to block the epitaxial growth of the P+ semiconductor material 18 and the intrinsic semiconductor material 16 over the CMOS device, e.g., source region 26 (e.g., N+ region), drain region 28 (e.g., P/N region) and gate structure. The oxide or other hardmask material may be removed by a conventional etching process after formation of the P+ semiconductor material 18 and the intrinsic semiconductor material 16.

The shallow trench isolation structure 31 may be formed by conventional lithography, etching and deposition methods known to those of skill in the art. For example, a resist formed over the substrate 24 is exposed to energy (light) to form a pattern (opening). An etching process with a selective chemistry, e.g., reactive ion etching (RIE), will be used to transfer the pattern from the photoresist layer to the substrate 24 to form one or more trenches in the substrate 24 through the openings of the resist. Following the resist removal by a conventional oxygen ashing process or other known stripants, the insulator material can be deposited by any conventional deposition processes, e.g., chemical vapor deposition (CVD) processes. In embodiments, the shallow trench isolation structure 31 may be planar with the substrate 24 or, alternatively, raised above a top surface of the substrate 24. Any residual material can be removed by conventional chemical mechanical polishing (CMP) processes.

Figure 3:
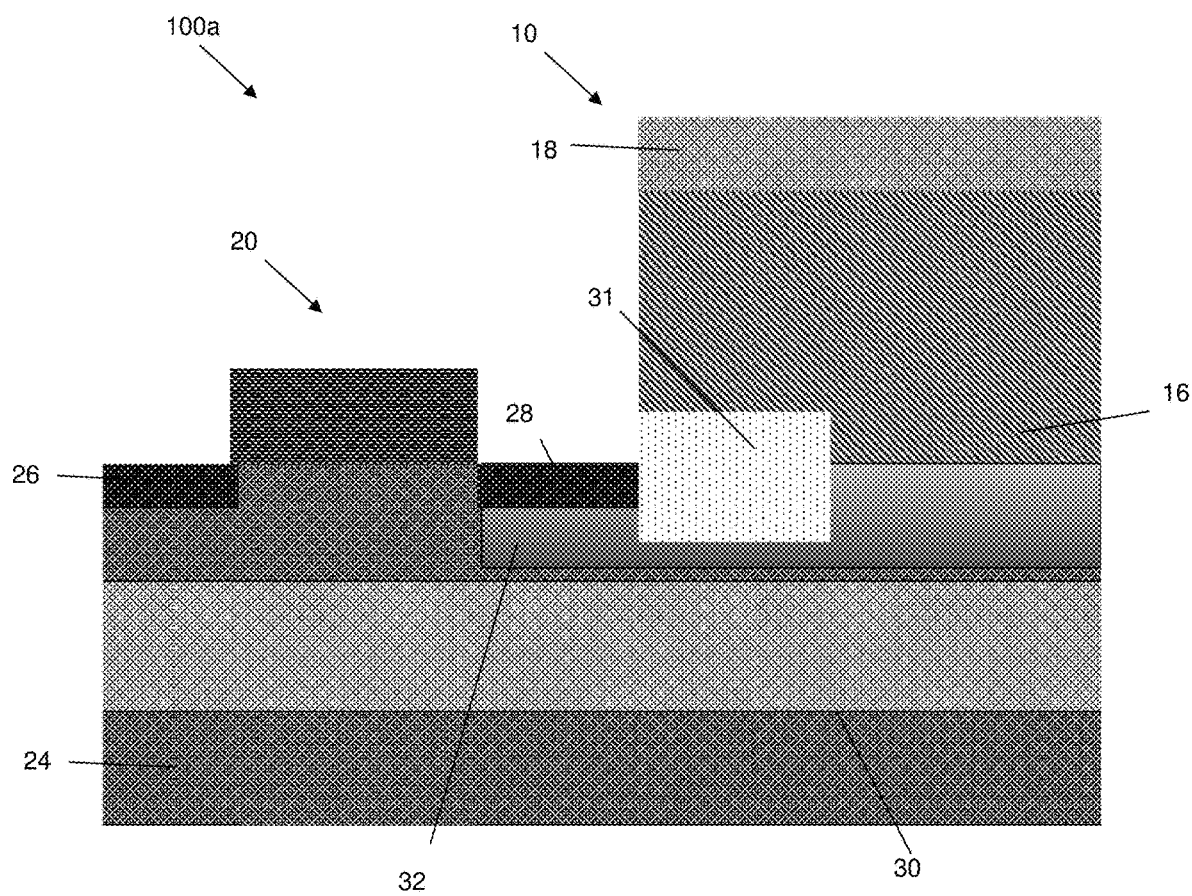

FIG. 3 shows the photodiode structure integrated with a CMOS device, amongst other features. In this integrated device 100a, the photodiode structure 10 may be planar with and connected to the CMOS device 20, e.g., FET. For example, in this embodiment, the photodiode structure 10 may be formed on the top surface of the substrate 24 using the epitaxial growth processes described herein. The CMOS device 20 may be a conventional transistor formed by any known processes, e.g., first gate process or replacement gate process, with a source region 26 (e.g., N+ region) and drain region 28 (e.g., P/N region). A shallow trench isolation structure 31 may be adjacent to the drain region 28, separating the CMOS device 20 from the photodiode structure 10, e.g., intrinsic semiconductor material 16. In embodiments, the shallow trench isolation structure 31 may be planar with the substrate 24 or, alternatively, raised above a top surface of the substrate 24.

As in the embodiment of FIG. 2, the substrate 24 may be a pSi semiconductor substrate, with a heavier doped P region 30 and lighter doped N region 32. Again, it should be understood by those of skill in the art that the heavily doped P region 30 and the lighter doped N region 32 may be the bottom terminal of the photodiode 10, e.g., N semiconductor material 14 and P semiconductor material 12 of FIG. 1. The N doped region 32, e.g., N semiconductor material 14 of FIG. 1, may extend to and contact an underside of the drain region 28. The doped regions, e.g., source region 26 (e.g., N+ region), drain region 28 (e.g., P/N region), heavily doped P region 30 and the N doped region 32, may be formed by introducing a dopant by, for example, ion implantation that introduces a concentration of a dopant in the substrate 24 (prior to the trench formation).

The intrinsic semiconductor material 16 may be epitaxially grown over the doped N region 32. The P+ semiconductor material 18 may be epitaxially grown on the intrinsic semiconductor material 16, with an in-situ doping process. In embodiments, an oxide material may be used to block the growth of the P+ semiconductor material 18 and the intrinsic semiconductor material 16 over the CMOS device, e.g., source region 26 (e.g., N+ region), drain region 28 (e.g., P/N region) and gate structure, which is later removed by a conventional etching process.

In operation, a voltage bias, e.g., 0V, is provided to the top terminal, e.g., semiconductor material 18 and a positive bias (e.g., 1-3V) is applied to the bottom terminal 32. The voltage bias will fully deplete the N semiconductor material 32. The photodiode structure 10 is then exposed to light, which generates electron hole pairs in the intrinsic semiconductor material 16. The N semiconductor material 32 can then detect the electron hole pairs, at which time the N semiconductor material 32 may no longer be fully depleted. For example, the electron carriers will be attracted to the fully depleted potential of the N semiconductor material 32 which will accumulate until the CMOS device 20, e.g., gate, is brought high for a readout. In other words, when the gate is turned on the electronic carriers will be pulled out of N semiconductor material 32 to a floating diffusion of the FET device 20 where they can then be read out by the gate. When the gate is turned off after the electron carriers have been pulled out (by applying an appropriate bias (2-3V on the drain), the N type diffusion layer, e.g., N semiconductor material 32, will again be fully depleted resulting in no charges in the n-region.

It should be recognized by those of skill in the art that the polarities described herein (e.g., N doped regions and P doped regions) of the devices can be flipped and still provide the same advantages and benefits described herein. For example, an NFET can be a PFET, with the n diffusions becoming p diffusions and the p diffusions becoming n diffusions.

The photodiodes can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a top terminal comprising P+ semiconductor material;
   an intrinsic material touching the top terminal;
   a bottom terminal in contact with the intrinsic material, the bottom terminal comprising a P semiconductor material and a fully depleted N semiconductor material; and
   an isolation structure above the bottom terminal and an underlying semiconductor substrate, the isolation structure touching the intrinsic material.

2. The structure of claim 1, wherein the P semiconductor material has a higher dopant concentration than the fully depleted N semiconductor material.

3. The structure of claim 2, wherein the P semiconductor material and the fully depleted N semiconductor material each comprise Si material.

4. The structure of claim 2, wherein the P semiconductor material comprises boron doped Si material and the fully depleted N semiconductor material comprises phosphorus doped Si material.

5. The structure of claim 4, wherein the intrinsic material comprises Ge material.

6. The structure of claim 1, further comprising a gate structure pinned to the fully depleted N semiconductor material.

7. The structure of claim 6, wherein the gate structure comprises a source region and a drain region, the drain region being pinned to the fully depleted N semiconductor material.

8. The structure of claim 6, wherein the bottom terminal is within a substrate material shared with the gate structure and the intrinsic material is within a trench in the substrate material.

9. The structure of claim 6, wherein the bottom terminal is within a substrate material shared with the gate structure and the intrinsic material is above the substrate material.

10. A structure comprising:
    a top terminal comprising P+ semiconductor material;
    an intrinsic material touching the top terminal;
    a bottom terminal in contact with the intrinsic material, the bottom terminal comprising a P semiconductor material and a fully depleted N semiconductor material;
    a shallow trench isolation structure separating the intrinsic material from a drain region of the gate structure; and
    a gate structure pinned to the fully depleted N semiconductor material,
    wherein the bottom terminal is within a substrate material shared with the gate structure and the intrinsic material is within a trench in the substrate material.

11. The structure of claim 10, wherein the shallow trench isolation structure is raised above the substrate and the top terminal is above the shallow trench isolation structure.

12. A structure comprising:
a pinned photodiode comprising a fully depleted semiconductor region, and an intrinsic region between an upper p-doped region and a lower n-doped region;
a transistor pinned to the pinned photodiode; and
an isolation structure touching the intrinsic semiconductor material and the lower n-doped region, both above the fully depleted semiconductor region, and separating a drain region of the transistor that is over the lower n-doped region from the intrinsic semiconductor material.

13. The structure of claim 12, wherein the fully depleted semiconductor region comprises an N semiconductor material between a P semiconductor material and the intrinsic semiconductor region.

14. The structure of claim 13, wherein the P semiconductor material comprises a higher dopant concentration than the N semiconductor material.

15. The structure of claim 14, wherein the N semiconductor material and the P semiconductor material are in a substrate material, and the intrinsic semiconductor region is within a trench of the substrate material.

16. The structure of claim 14, wherein the N semiconductor material and the P semiconductor material are in a substrate material, and the intrinsic region is above the substrate material.

17. A method comprising:
forming a top terminal comprising P+ semiconductor material;
forming an intrinsic material touching the top terminal;
forming a bottom terminal in contact the intrinsic material, the bottom terminal comprising a P semiconductor material and a fully depleted N semiconductor material; and
forming an isolation structure above the bottom terminal and an underlying semiconductor substrate, the isolation structure touching the intrinsic material.

18. A structure comprising:
a top terminal comprising P+ semiconductor material;
an intrinsic material touching the top terminal;
a bottom terminal in contact with the intrinsic material, the bottom terminal comprising a P semiconductor material and a fully depleted N semiconductor material; and
an isolation structure above the bottom terminal, and adjacent to and touching the intrinsic material above and to a side of the bottom terminal, and wherein the bottom terminal touches the intrinsic material.

* * * * *